(12) United States Patent
Gritters et al.

(10) Patent No.: US 7,674,112 B2
(45) Date of Patent: Mar. 9, 2010

(54) RESILIENT CONTACT ELEMENT AND METHODS OF FABRICATION

(75) Inventors: John K. Gritters, Livermore, CA (US); Benjamin N. Eldridge, Danville, CA (US); Keith J. Breinlinger, San Ramon, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 11/617,373

(22) Filed: Dec. 28, 2006

(65) Prior Publication Data

US 2008/0157799 A1 Jul. 3, 2008

(51) Int. Cl.
*H01R 31/02* (2006.01)
(52) U.S. Cl. .................................... 439/66; 439/862
(58) Field of Classification Search .................. 439/66, 439/862
See application file for complete search history.

(56) References Cited

U.S. PATENT DOCUMENTS

| | | | |
|---|---|---|---|
| 4,790,898 A | 12/1988 | Woods | |
| 6,064,213 A | 5/2000 | Khandros | |
| 6,143,668 A | 11/2000 | Dass et al. | |
| 6,184,053 B1 | 2/2001 | Eldridge et al. | |
| 6,482,013 B2 | 11/2002 | Eldridge et al. | |
| 6,499,216 B1 | 12/2002 | Fjelstad | |
| 6,713,374 B2 | 3/2004 | Eldridge et al. | |
| 6,827,584 B2 | 12/2004 | Mathieu | |
| 6,948,940 B2 | 9/2005 | Lindsey | |
| 7,047,638 B2 | 5/2006 | Eldridge | |
| 7,140,883 B2 | 11/2006 | Khandros et al. | |
| 7,435,108 B1 | 10/2008 | Eldridge | |
| 7,458,816 B1 | 12/2008 | Mathieu | |
| 2003/0199179 A1 | 10/2003 | Dozier, II et al. | |
| 2006/0085976 A1 | 4/2006 | Eldridge | |
| 2006/0276085 A1* | 12/2006 | Ma et al. | 439/862 |
| 2007/0141743 A1 | 6/2007 | Mathieu | |
| 2008/0074132 A1 | 3/2008 | Fan | |

FOREIGN PATENT DOCUMENTS

| | | |
|---|---|---|
| WO | WO 98/52224 | 11/1998 |
| WO | WO 02/063682 | 8/2002 |

OTHER PUBLICATIONS

International Search Report and Written Opinion mailed Jul. 7, 2008 for PCT Application No. PCT/US2007/085481.

* cited by examiner

*Primary Examiner*—Gary F. Paumen
(74) *Attorney, Agent, or Firm*—N. Kenneth Burraston

(57) ABSTRACT

Embodiments of resilient contact elements and methods for fabricating same are provided herein. In one embodiment, a resilient contact element for use in a probe card includes a lithographically formed resilient beam having a first end and an opposing second end; and a tip disposed proximate the first end of the beam and configured to break through an oxide layer of a surface of a device to be tested to establish a reliable electrical connection therewith; wherein at least a central portion of the beam has a continuous sloped profile defining, in a relaxed state, a height measured between the beam and a plane representing an upper surface of a device to be tested that is greater near the second end of the beam than near the first end of the beam.

16 Claims, 12 Drawing Sheets

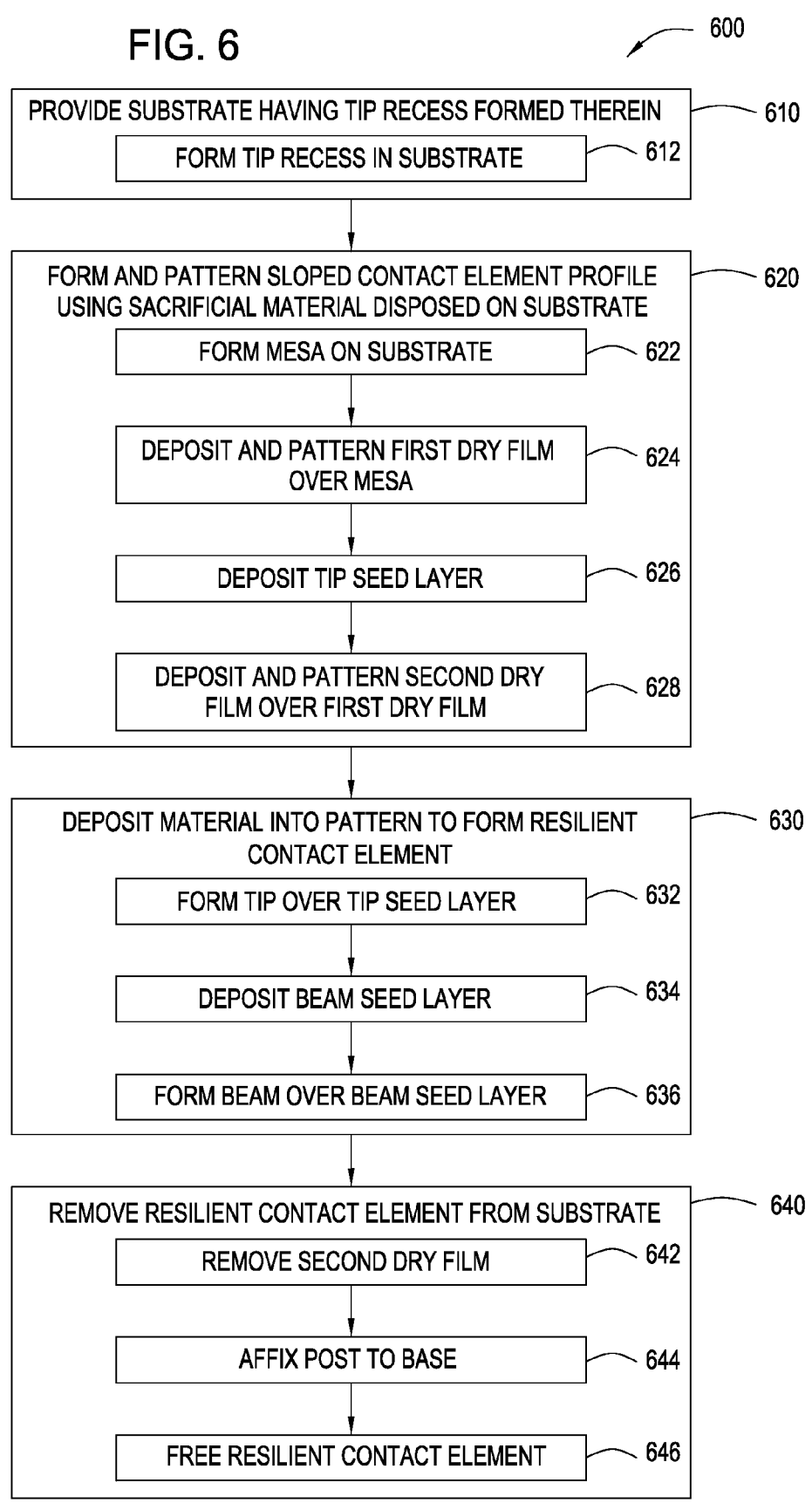

RESILIENT CONTACT ELEMENT AND METHODS OF FABRICATION

CROSS-REFERENCE TO RELATED APPLICATIONS

This application is related to U.S. patent application Ser. No. 11/617,394 filed on Dec. 28, 2006, by Eric D. Hobbs, and entitled, "Rotating Contact Element and Methods of Fabrication". The aforementioned patent application is incorporated herein by reference in its entirety.

BACKGROUND OF THE INVENTION

1. Field of the Invention

Embodiments of the present invention generally relate to testing of partially or fully completed semiconductor devices, and more particularly, to resilient contact elements for use in a probe card assembly for testing such devices.

2. Description of the Related Art

When testing partially or fully completed semiconductor devices formed on a semiconductor substrate, such as integrated circuits and the like, a contact element is typically brought into contact with the device to be tested—also referred to as a device under test (or DUT). The contact element is typically part of a probe card assembly or other similar device coupled to a test mechanism that provides electrical signals to terminals on the DUT in accordance with a predetermined testing protocol. This testing is typically done in a controlled environment (e.g., a clean room) to minimize the size and number of particles in the testing environment. However, even when testing in a controlled environment, and more particularly in situations where testing is not performed in a controlled environment, particles may become disposed on the surface of the DUT may interfere with the testing. Moreover, such particles may further deform or break the contact elements disposed in the probe card assembly when a particle strike occurs.

For example, FIG. 1 depicts a conventional contact element 100 including a beam 104 and a tip post 106 having a tip 108 formed or disposed at a distal end of the tip post 106 and configured for contacting the DUT during testing. The beam 104 is coupled to a post 102 at an end opposite the tip 108. The post 102 is utilized to couple the contact element 100 to a probe card assembly. A particle 112 may be disposed on a surface of a substrate or DUT (illustratively depicted in FIG. 1 as reference plane 110) and thereby interfere with testing the DUT. If the tip 108 and/or tip post 106 comes into contact with the particle 112, a misprobe may occur and the contact element 100 may be further be deformed or deflected to a position such that the contact element 100 becomes permanently deformed (i.e., the contact element undergoes plastic deformation). Such plastic deformation may occur even where the particle 112 contacts the beam 104 at any other point along its length including beneath the post 102. Moreover, depending upon the particle size and the quantity of deflection of the contact element 100, the post 102, beam 104, or tip post 106 may break and become detached from the probe card assembly, particularly in instances where the particle contacts the contact element 100 near or beneath the post 102.

One method to try to decrease the probability of a particle strike is to increase the length of the tip post 106, thereby raising the height of the beam 104 with respect to the reference plane 110. However, such a design undesirably increases the scrub of the contact element (the forward distance that the tip moves after contacting the surface of the DUT, sometimes referred to as the scrub ratio when dividing the forward distance moved by the tip by the downward distance moved by the contact element after initial contact with the DUT).

Therefore, there is a need in the art for an improved contact element.

SUMMARY OF THE INVENTION

Embodiments of resilient contact elements and methods for fabricating same are provided herein. In one embodiment, a resilient contact element for use in a probe card includes a lithographically formed resilient beam having a first end and an opposing second end; and a tip disposed proximate the first end of the beam and configured to break through an oxide layer of a surface of a device to be tested to establish a reliable electrical connection therewith; wherein at least a central portion of the beam has a continuous sloped profile defining, in a relaxed state, a height measured between the beam and a plane representing an upper surface of a device to be tested that is greater near the second end of the beam than near the first end of the beam.

In some embodiments of the invention a probe card assembly for testing a semiconductor is provided. In some embodiments, a probe card assembly for testing a semiconductor includes a probe substrate; and a resilient contact element coupled to the probe substrate, the resilient contact element comprising: a lithographically formed resilient beam having a first end and an opposing second end; and a tip disposed proximate the first end of the beam and configured to break through an oxide layer of a surface of a device to be tested to establish reliable electrical connection therewith; wherein the beam has a continuous sloped profile defining, in a relaxed state, a height measured between the beam and a plane representing an upper surface of a device to be tested that is greater near the second end of the beam than near the first end of the beam.

In some embodiments of the invention a method of fabricating a resilient contact element is provided. In some embodiments, a method of fabricating a resilient contact element includes a) providing a substrate having a tip recess formed therein; b) forming and patterning a sloped contact element profile using a sacrificial material disposed on the substrate and aligned with the tip recess; c) depositing material into the pattern provided by the sacrificial material to form a resilient contact element; and d) removing the resilient contact element from the substrate.

In some embodiments of the invention, a method of fabricating a resilient contact element is provided. In some embodiments, a method of fabricating a resilient contact element includes a) providing a substrate having a conductive through-via; b) forming and patterning a sloped contact element profile using a sacrificial material disposed on the substrate and aligned with the via; c) depositing material into the pattern provided by the sacrificial material to form a resilient contact element; and d) freeing the resilient contact element.

In some embodiments of the invention, a method of fabricating a resilient contact is provided. In some embodiments, a method of fabricating a resilient contact element includes a) providing a contact element having a first topography, the contact element having a tip end and a support end; and b) applying a deforming force to the contact element to cause the tip end to move from the support end in a direction substantially parallel to the deforming force to form a resilient contact element having a second topography different than the first.

In some embodiments of the invention, a method for testing a device using a probe card assembly is provided. In some embodiments, a method of testing a device with a probe card assembly includes providing a probe card assembly comprising a plurality of resilient contact elements as described in claim 1 coupled thereto; contacting a plurality of terminals of the device with respective tips of the resilient contact elements; and providing one or more electrical signals to at least one of the terminals through the probe card assembly.

In some embodiments of the invention, a semiconductor device is provided that has been tested by methods of the present invention. In some embodiments, a semiconductor device is provided that has been tested by providing a probe card assembly comprising a plurality of resilient contact elements as described in claim 1 coupled thereto; contacting a plurality of terminals of the device with respective tips of the resilient contact elements; and providing one or more electrical signals to at least one of the terminals through the probe card assembly.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 6 depicts a flowchart for fabricating the resilient contact element depicted in FIGS. 5A-F.

To facilitate understanding, identical reference numerals have been used, where possible, to designate identical elements that are common to the figures. The above drawings are not to scale and may be simplified for illustrative purposes.

DETAILED DESCRIPTION

The present invention provides embodiments of a resilient contact element, and probe card assemblies incorporating same, having improved capability to withstand particle strikes during testing of a device under test (DUT). Methods for the fabrication and use of the resilient elements are further provided. The resilient contact element advantageously provides improved particle strike performance with a decreased scrub as compared to conventional contact elements.

Figure 2:
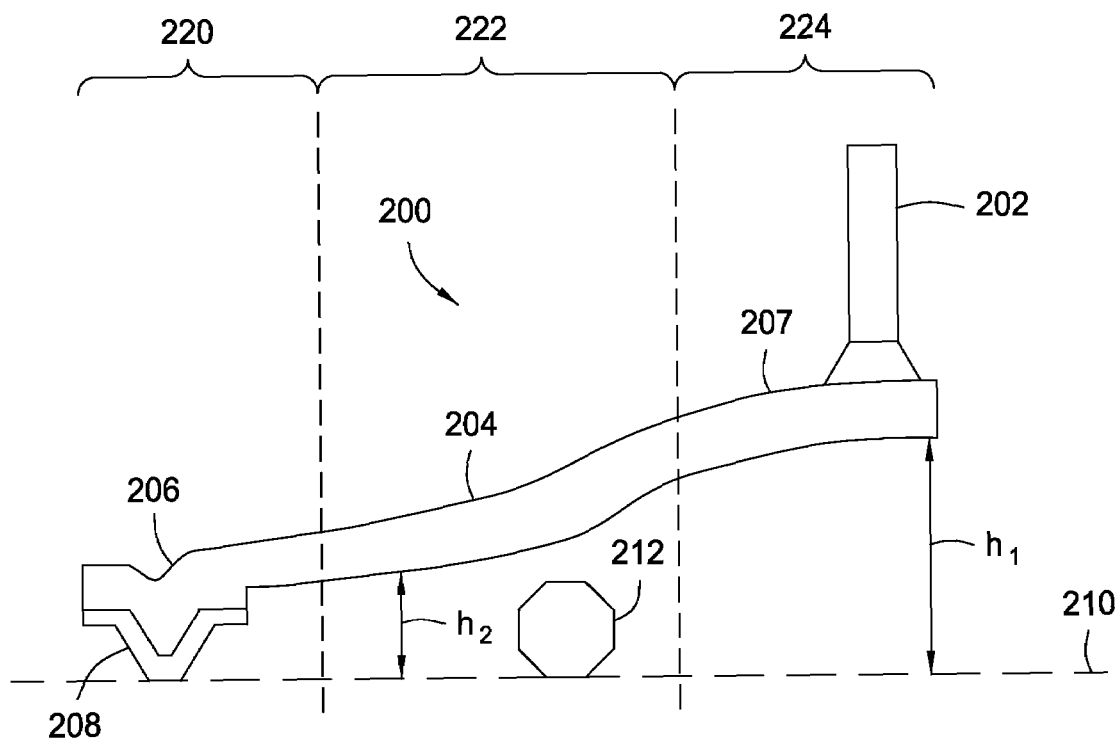
FIG. 2 depicts a resilient contact element according to some embodiments of the present invention.

FIG. 2 depicts a resilient contact element 200 in accordance with some embodiments of the present invention. The resilient contact element 200 can include a beam 204 having a first end 206 configured with a tip 208 for contacting the surface of a DUT and a second end 207 configured to be attached to a supporting substrate (not shown). The beam 204 may comprise one or more layers and may comprise one or more electrically conductive and/or nonconductive materials. Examples of suitable conductive materials include metals. In some embodiments, the beam 204 may comprise nickel, copper, cobalt, iron, gold, silver, elements of the platinum group, noble metals, semi-noble metals, elements of the palladium group, tungsten, molybdenum, beryllium, and the like, and alloys thereof (such as nickel-cobalt alloys and the like). The tip 208 may fabricated from any of the above materials and may be formed integrally with the beam 204 or may comprise a separate layer or layers.

The beam 204 typically has a spring constant and yield strength suitable for developing sufficient contact force when contacting a DUT (e.g., sufficient to break through an oxide layer on the surface of the DUT) for repeated contacting of DUT contact elements without permanent deformation. In some instances a plurality of the beams across a probing surface may be compliant enough to allow sufficient overtravel to facilitate contacting a plurality of contact elements to the DUT, which may be at different heights. In a non-limiting exemplary range, the amount of overtravel may be between about 1-4 mils. In some embodiments, the beam 204 may have a spring constant in a non-limiting exemplary range of between about 0.5-5 grams force per mil of movement. In some embodiments, the contact force developed during testing may be less that about 5 grams force, or in some embodiments between about 0.5-5 grams force. It is contemplated that the beam 204 may have other spring constants for applications where lesser or greater contact forces are required to establish reliable temporary electrical contact with the DUT without damaging either the resilient contact element or the DUT. Moreover, it is contemplated that as dimensions of the features being tested on a DUT continue to shrink, the specific dimensions, spring constants, overtravel requirements, and the like for the resilient contact element 200 may change while still remaining within the scope of this invention.

The beam 204 may be contoured (i.e., curved) or linear, and has a sloped profile (i.e., the beam 204 is configured to have an increasing height along its length from the first end 206 to the second end 207), thereby reducing the probability of a catastrophic particle strike near the second end 207 of the beam 204. In embodiments where the beam 204 is curved, the resilient contact element 200 is further advantageously more compact (i.e., has a shorter horizontal projection). As shown in FIG. 2, when the resilient contact element 200 is oriented to contact a DUT (represented by a reference plane 210) a first height $h_1$ (defined as a distance between the beam 204 and the reference plane 210 proximate the second end 207 of the beam 204) is greater than a second height $h_2$ (defined as a distance between the beam 204 and the reference plane 210 along other portions of the beam 204 closer to the first end 206 of the beam 204).

The resilient contact element 200 thus may contain a base portion 224 disposed proximate the second end 207 of the beam 204, a tip portion 220 proximate the first end 206 of the beam 204, and a middle portion 222 disposed therebetween. The beam 204 can be sloped such that at least the middle portion 224 slopes downward from the second end 207 (i.e., the base portion 224) toward the first end 206 of the beam 204 (i.e., the tip portion 220). Such a configuration advantageously provides a height differential such that a particle 212—which may, in a non-limiting example, be up to about 100 micrometers (μm) in size—disposed along the reference plane 210 (i.e., on a surface of a DUT) is more likely to be avoided when the tip 208 of the resilient contact element 200 comes into contact with the device to be tested. In addition, when the resilient contact element 200 is moved towards the surface of the DUT, the likelihood of deflection due to contact or interference with the particle 212 is greatly reduced. Furthermore, where contact may occur, the likelihood of a plastic deformation or a breakage of the resilient contact element 200 is also greatly reduced. Additionally, because there is a higher probability of permanently damaging the connection of the beam 204 to a post 202 and/or the post 202 to an attachment substrate (not shown in FIG. 2) when a particle strike occurs closer to the second end 207, the resilient contact element 200 further advantageously reduces the likelihood of such a catastrophic event due to the increased height $h_1$ of the base portion 224.

Figure 1:
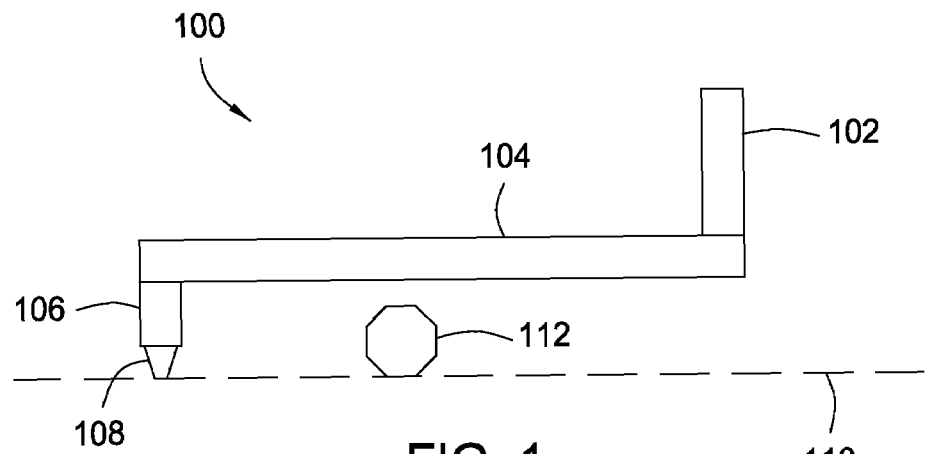
FIG. 1 is a schematic diagram of a contact element of the prior art.

In addition to the aforementioned benefits, the resilient contact element 200 can provide a reduced scrub (and scrub ratio) as compared to conventional contact elements having the same particle clearance. The particle clearance is defined by the height $h_1$ of the resilient contact element 200, and corresponds to an equivalent tip-to-beam distance in a conventional cantilevered beam contact element. Specifically, as the first end 206 of the resilient contact element 200 is closer to the reference plane 210, the tip 208 is not extended from the beam 204 as great a distance as, for example, by the tip post 106 of the conventional contact element shown in FIG. 1. The reduced distance between the tip 208 and the beam 204 reduces the magnitude of any moment applied to the tip 208 by the flexing of the beam 204, thereby reducing the magnitude of the forward travel of the tip 208 as the beam 204 is deflected by contacting the DUT. Therefore, the tip 208 has a lower scrub distance for a given particle clearance height when contacting the DUT. Thus, the scrub distance of the resilient contact element 200 can be advantageously reduced, as compared to conventional contact elements having the same particle clearance.

Furthermore, as the sloped profile of the resilient contact element 200 has a lower effective point of rotation of the element when contacting a DUT as compared to a contact element having a cantilevered beam, the scrub ratio (defined as the scrub distance divided by the distance between the surface of the DUT and the point of rotation) for the resilient contact element 200 is lower than the scrub ratio of a conventional contact element for a given particle clearance height. Therefore, the resilient contact element 200 has a lower scrub ratio for a given particle clearance height when contacting the DUT. Thus, the scrub ratio can be advantageously reduced, as compared to conventional contact elements having the same particle clearance.

A tip 208 can be disposed proximate the first end 206 of the beam 204 and can be configured to contact the surface of a DUT during testing. The tip 208 may be fabricated from the same materials as the beam 204 or may be fabricated from different materials, thereby decoupling the contact requirements of the tip 208 from the spring constant requirements of the beam 204. The tip 208 may comprise materials of suitable hardness and conductivity to provide the required contact with the DUT, as described above. Typical materials for the tip may include noble metals and the like.

A post 202 is coupled to the beam 204 proximate the second end 207. The post 202 is configured to support the resilient contact element 200 (for example from a probe card assembly as discussed below with respect to FIG. 4) as well as to provide an electrical pathway to facilitate electrical communication between the tip 208 and a test system (discussed in more detail below with respect to FIG. 4). Accordingly, the post 202 typically comprises a stiff, conductive material that has minimal or no deformation or deflection during operation (e.g., materials having a high modulus). Examples of suitable materials include metals or metal coated materials. The post 202 may be formed and coupled to the beam 204 by any suitable method, such as by soldering, wirebonding and overplating, molding and electroplating, or the like. Due to the sloped profile of the resilient contact element 200, the post 202 can advantageously have a reduced height as compared to conventional contact elements. Alternatively, the beam 204 may be shaped such that the second end 207 of the beam 204 is utilized to support the resilient contact element 200 in place of the post 202.

Figure 3:
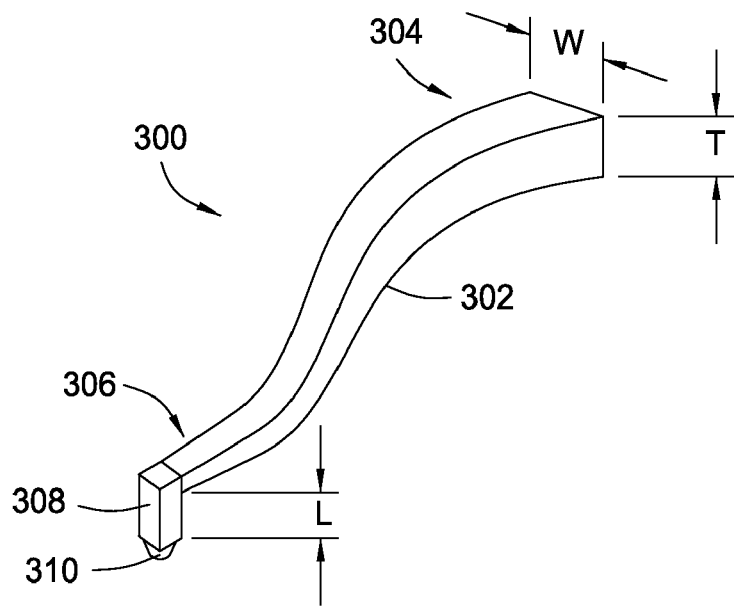
FIG. 3 depicts a perspective view of a resilient contact element according to some embodiments of the present invention.

FIG. 3 depicts a perspective view of some embodiments of a resilient contact element 300 similar to the resilient contact element 200 described above with respect to FIG. 2. The resilient contact element 300 has a beam 302 having a tip post 308 disposed at a first end 306 opposite a second end 304 of the beam 302. A tip 310 may be formed in or disposed on the tip post 308 and configured to contact the surface of a DUT. The beam 302 of the resilient contact element 300 may have a thickness, T, that varies along the length of the beam 302. For example, the thickness may be greater proximate the second end 304 of the beam 302 and gradually reduce toward the first end 306 of the beam 302.

Similarly, a width, W, of the beam 302 may also vary along the length of the beam 302. For example, the width may be greater proximate the second end 304 of the beam 302 and gradually taper towards the first end 306 of the beam 302. The variation in the thickness and width of the beam 302 may be selectively controlled in order to control the spring constant of the resilient contact element 300 and/or performance characteristics of the resilient contact element 300. The variation in the thickness and width of the beam 302 may further be selectively controlled to form a geometry suitable for providing a plurality of resilient contact elements in an array having a first pitch proximate the tips 310 of the resilient contact elements that is smaller than a pitch of contact pads formed on a DUT, and a second pitch proximate the second ends 304 of the beams 302 to facilitate connection to a support, such as a probe card assembly, as discussed below with respect to FIG. 4. In some embodiments, the width of the second end 304 of the beam 302 can be about 2 or more times greater than the width of the first end 306 of the beam 302.

The resilient contact element 300 further has a length L defined between a bottom portion of the beam 302 proximate the first end 306 of the beam 302 and the tip 310 of the resilient contact element 300. Due to the sloped profile of the resilient contact element 300, the length L for the resilient contact element 300 is less than a length from the beam to the tip of a conventional contact element 100 having a comparable particle clearance height. Accordingly, the resilient contact element 300 may advantageously provide a lower scrub distance (and scrub ratio) while providing the same contact force required during testing of a DUT.

The resilient contact elements described herein may be utilized in various applications, including as a probe element in a probe card assembly for testing devices formed on semiconductor substrates. Accordingly, the resilient contact element may have dimensions suitable for the particular application. In some embodiments, the resilient contact element may have an overall length of between about 1-2 mm. In some embodiments, the resilient contact element may have a width of between about 40-80 μm for the first end 206 and about 80-200 μm for the second end 304. In some embodiments, the resilient contact element may have a height $h_1$ (as shown in FIG. 2) of between about 150 μm to about 300 μm. The thickness of the resilient contact element is typically selected to maintain the spring constant and performance characteristics discussed above and, in some embodiments, may be between about 30-90 μm, or about 60 μm. The taper of the resilient contact element is typically selected to maintain the spring constant and performance characteristics discussed above as well as to facilitate a desired geometry where pluralities of resilient contact elements are arranged, for example on a probe card assembly (discussed with respect to FIG. 4, below). The foregoing dimensions are illustrative only and reflect common application in testing conventional devices. It is contemplated that the resilient contact element may have other dimensions in applications where larger or smaller devices are being tested. For example, the dimensions of the resilient contact element may be selected to meet certain design characteristics, such as matching the pitch of contact pads on a DUT and generating sufficient contact force to establish a reliable electrical contact therewith.

Figure 4:
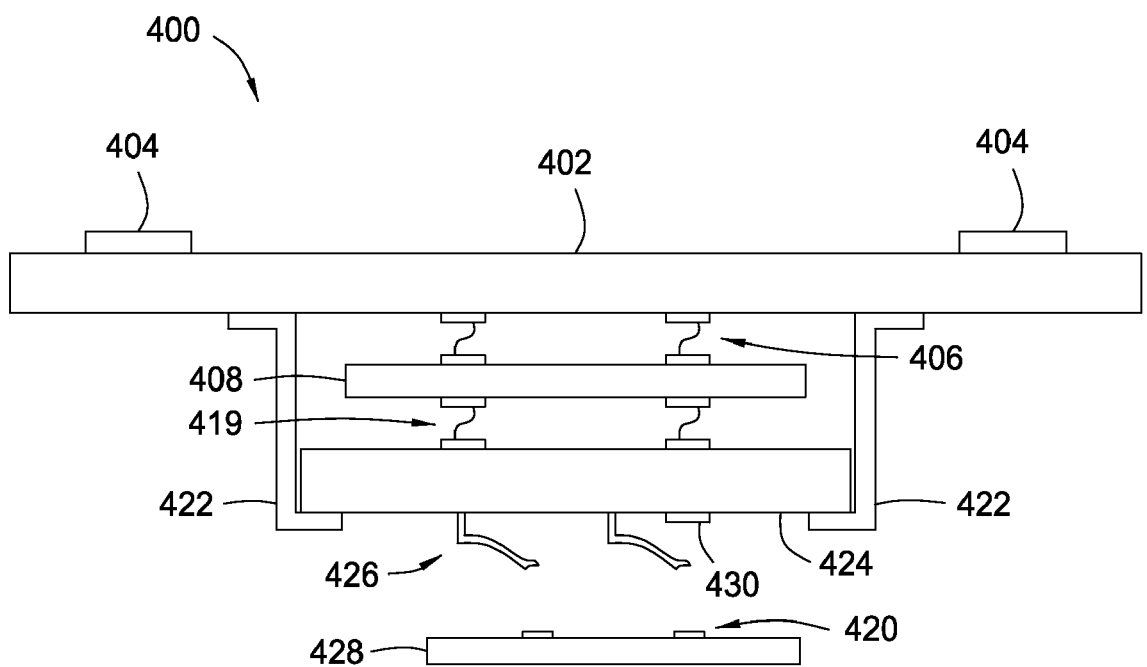
FIG. 4 depicts a probe card assembly having a resilient contact element according to some embodiments of the present invention.

FIG. 4 depicts a probe card assembly 400 utilizing one or more resilient contact elements according to some embodiments of the present invention. The exemplary probe card assembly 400 illustrated in FIG. 4 can be used to test one or more electronic devices (represented by DUT 428). The DUT 428 can be any electronic device or devices to be tested. Non-limiting examples of a suitable DUT include one or more dies of an unsingulated semiconductor wafer, one or more semiconductor dies singulated from a wafer (packaged or unpackaged), an array of singulated semiconductor dies disposed in a carrier or other holding device, one or more multi-die electronics modules, one or more printed circuit boards, or any other type of electronic device or devices. The term DUT, as used herein, refers to one or a plurality of such electronic devices.

The probe card assembly 400 generally acts as an interface between a tester (not shown) and the DUT 428. The tester, which can be a computer or a computer system, typically controls testing of the DUT 428, for example, by generating test data to be input into the DUT 428, and receiving and evaluating response data generated by the DUT 428 in response to the test data. The probe card assembly 400 includes electrical connectors 404 configured to make electrical connections with a plurality of communications channels (not shown) from the tester. The probe card assembly 400 also includes one or more resilient contact elements 426 configured to be pressed against, and thus make temporary electrical connections with, one or more input and/or output terminals 420 of DUT 428. The resilient contact elements 426 may be similar to the various embodiments disclosed herein and are typically configured to correspond to the terminals 420 of the DUT 428 and may be arranged in one or more arrays having a desired geometry.

The probe card assembly 400 may include one or more substrates configured to support the connectors 404 and the resilient contact elements 426 and to provide electrical connections therebetween. The exemplary probe card assembly 400 shown in FIG. 4 has three such substrates, although in other implementations, the probe card assembly 400 can have more or fewer substrates. In the embodiment depicted in FIG. 4, the probe card assembly 400 includes a wiring substrate 402, an interposer substrate 408, and a probe substrate 424. The wiring substrate 402, the interposer substrate 408, and the probe substrate 424 can generally be made of any type of suitable material or materials, such as, without limitation, printed circuit boards, ceramics, organic or inorganic materials, and the like, or combinations thereof.

Additionally, in some embodiments, the probe card assembly 400 may include one or more active or passive electronic components (such as capacitors, resistors, and the like) disposed on a lower surface thereof, along with the plurality of resilient contact elements 426. For example, as shown in FIG. 4, a component 430 is disposed on a lower surface of the wiring substrate 424. As can be seen in the Figure, the tip of the resilient contact elements 426 and at least a portion of the component 430 may overlap each other. The sloped profile of the resilient contact elements 426 advantageously provides the necessary clearance to avoid contact with the component 430 during the deflection of the tips of resilient contact elements 426 while simultaneously providing greater clearance to avoid particle strikes, as discussed above.

Electrically conductive paths (not shown) are typically provided from the connectors 404 through the various substrates to the resilient contact elements 426 and components 430. For example, in the embodiment depicted in FIG. 4, electrically conductive paths (not shown) may be provided from the connectors 404 through the wiring substrate 402 to a plurality of electrically conductive spring interconnect structures 406. Other electrically conductive paths (not shown) may be provided from the spring interconnect structures 406 through the interposer substrate 408 to a plurality of electrically conductive spring interconnect structures 419. Still other electrically conductive paths (not shown) may further be provided from the spring interconnect structures 419 through the probe substrate 424 to the resilient contact elements 426 and/or any components 430. The electrically conductive paths through the wiring substrate 402, the interposer substrate 408, and the probe substrate 424 can comprise electrically conductive vias, traces, or the like, that may be disposed on, within, and/or through the wiring substrate 402, the interposer substrate 408, and the probe substrate 424.

The wiring substrate 402, the interposer substrate 408, and the probe substrate 424 may be held together by one or more brackets 422 and/or other suitable means (such as by bolts, screws, or other suitable fasteners). The configuration of the probe card assembly 400 shown in FIG. 4 is exemplary only and is simplified for ease of illustration and discussion and many variations, modifications, and additions are contemplated. For example, a probe card assembly may have fewer or more substrates (e.g., 402, 408, 424) than the probe card assembly 400 shown in FIG. 4. As another example, a probe card assembly may have more than one probe substrate (e.g., 424), and each such probe substrate may be independently adjustable. Non-limiting examples of probe card assemblies with multiple probe substrates are disclosed in U.S. patent application Ser. No. 11/165,833, filed Jun. 24, 2005. Additional non-limiting examples of probe card assemblies are illustrated in U.S. Pat. No. 5,974,662, issued Nov. 2, 1999 and U.S. Pat. No. 6,509,751, issued Jan. 21, 2003, as well as in the aforementioned U.S. patent application Ser. No. 11/165,833. It is contemplated that various features of the probe card assemblies described in those patents and application may be implemented in the probe card assembly 400 shown in FIG. 4 and that the probe card assemblies described in the aforementioned patents and application may benefit from the use of the inventive resilient contact elements disclosed herein.

In operation, the resilient contact elements 426 are brought into contact with the terminals 420 of the DUT 428 by moving at least one of the DUT 428 or the probe card assembly 400. Typically, the DUT 428 can be disposed on a movable support disposed in the test system (not shown) that moves the DUT 428 into sufficient contact with the resilient contact elements 426 to provide reliable electrical contact with the terminals 420. The DUT 428 can then tested per a pre-determined protocol as contained in the memory of the tester. For example, the tester may generate power and test signals that are provided through the probe card assembly 400 to the DUT 428. Response signals generated by the DUT 428 in response to the test signals are similarly carried through the probe card assembly 400 to the tester, which may then analyze the response signals and determine whether the DUT 428 responded correctly to the test signals.

When moving the DUT 428 to contact the resilient contact elements 426 of the probe card assembly 400, the DUT 428 typically continues to move towards the probe card assembly 400 until all of the resilient contact elements 426 come into sufficient contact with the terminals 420. Due to one or both of the non-planarity of the respective tips of the resilient contact elements 426 disposed on the probe card assembly 400 and the variations of the heights of the terminals 420, the DUT 428 may continue to move towards the probe card assembly 400 for an additional non-limiting exemplary range of about 1-4 mils (about 25.4-102 μm) after the initial contact of the first resilient contact element 426 to contact the DUT 428 (sometimes referred to as overtravel). The actual amount of overtravel depends on the characteristics of the non-planarity of the respective tips of the resilient contact elements 426 and/or the variations in height of the terminals 420. Accordingly, some of the resilient contact elements 426 may undergo more deflection than others. However, the sloped profile of the resilient contact elements 426 of the present invention advantageously reduces the probability of a particle strike interfering with the testing of the DUT 428 and further advantageously reduce the probability that a particle strike may damage or break the resilient contact elements 426 even after full overtravel of the resilient contact elements 426.

Figure 11:
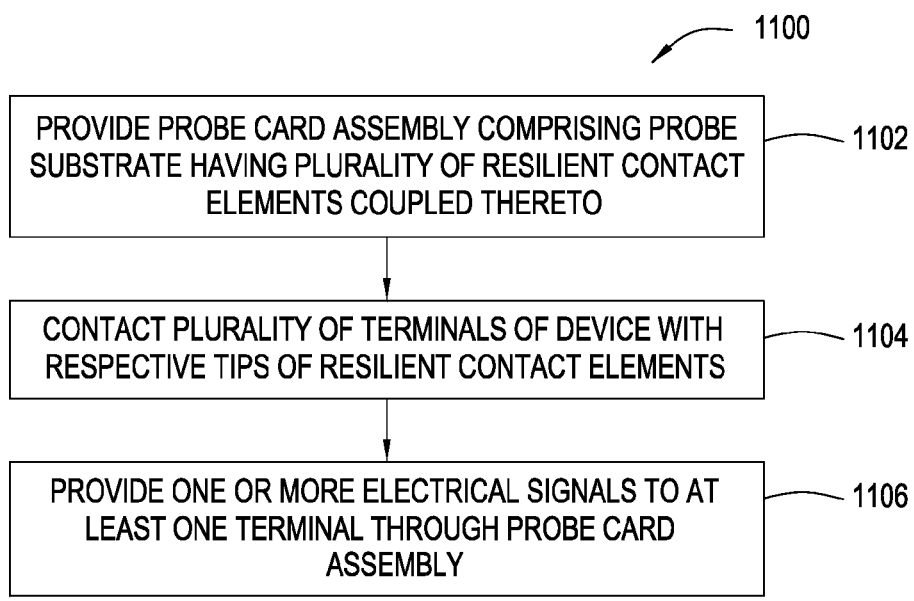
FIG. 11 depicts a flowchart of a method of testing a substrate in accordance with some embodiments of the present invention.

For example, FIG. 11 depicts a process 1100 for testing a semiconductor device, or DUT, utilizing a probe card assembly 400 as described above with respect to FIG. 4 according to some embodiments of the invention. The process 1100 begins at 1102, where a probe card assembly 400 is provided having a plurality of resilient contact elements 426 coupled thereto. Next, at 1104, a plurality of terminals 420 of a DUT 428 are contacted with respective tips of the resilient contact elements 426. Next, at 1106, one or more electrical signals are provided to at least one terminal 420 of the DUT 428 through the resilient contact elements 426.

FIGS. 5A-F depict various illustrative stages of construction or fabrication of a resilient contact element in accordance with some embodiments of the present invention. FIG. 6 depicts a process 600 of fabrication of the resilient contact element shown in FIGS. 5A-F according to some embodiments of the invention. Although the following discussion with respect to FIGS. 5-10 reflect the fabrication of a single resilient contact element, it is contemplated that a plurality of resilient contact elements may be simultaneously fabricated on a substrate utilizing any of the following methods.

Figure 5A:
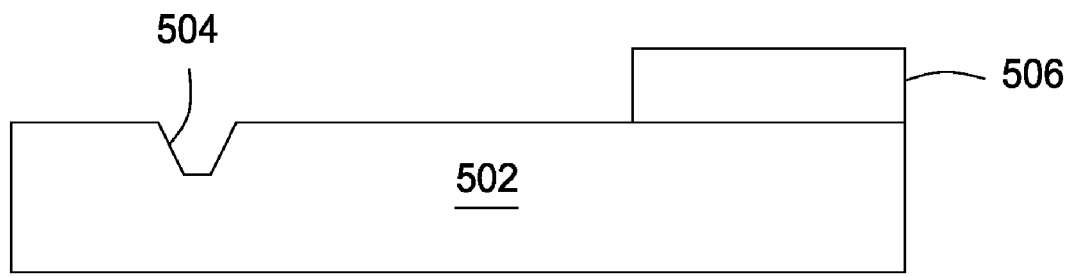
FIGS. 5A-F depict stages of fabrication of a resilient contact element in accordance with some embodiments of the present invention.

The exemplary process 600 begins at 610 wherein a substrate 502 can be provided having a tip recess 504 formed therein, as shown in FIG. 5A. The substrate may comprise any suitable substrate, and in one embodiment comprises silicon. The tip recess 504 can be geometrically configured to correspond to a contact tip to be formed on the resilient contact element. Optionally, the tip recess 504 may be formed in the substrate 502, as shown at 612. The tip recess 504 may be formed in the substrate 502 by any suitable process, such as by depositing and patterning a photoresist layer upon the substrate 502 corresponding to the location of the tip recess and etching the tip recess 504 into the substrate 502. Although FIG. 5 illustrates one type of tip recess 504, other recess geometries for forming other types of tips may similarly be used in various embodiments of the invention.

Figure 5B:
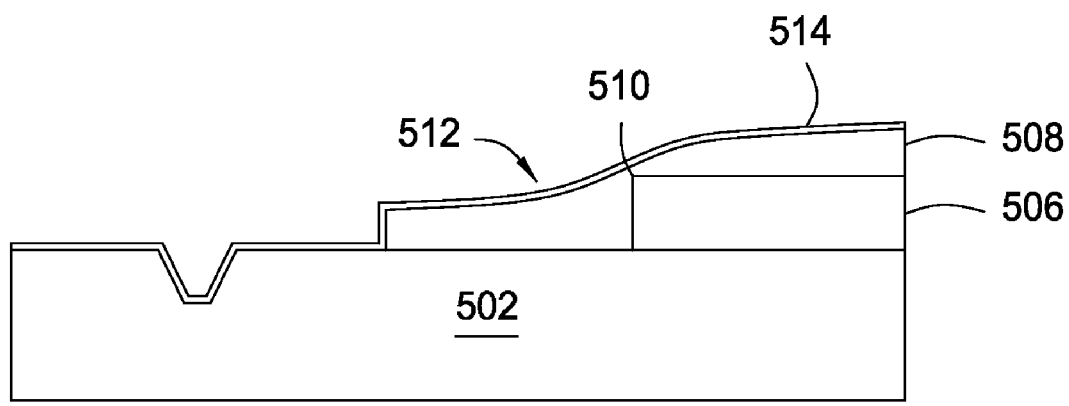

Next, at 620, a sloped contact element profile 512 may be formed using one or more sacrificial materials disposed on the substrate 502. For example, a mesa 506 can be formed on the substrate 502 at 622, such as by depositing and patterning a layer of dry film or liquid photoresist material on the substrate 502. Next, at 624, a first dry film 508 may be deposited and patterned over the mesa 506. The first dry film 508 may be deposited by a vacuum lamination or a vacuum-heated plunger method using a contoured mandrel. In some embodiments, when the first dry film 508 is deposited by vacuum lamination, a feature 510 of the mesa 506, such as an upper corner, may cause the first dry film 508 to develop the sloped profile 512 as the first dry film 508 is drawn over the mesa 506, the feature 510, and ultimately, the substrate 502. In some embodiments, when the first dry film 508 is deposited and formed by a vacuum-heated plunger, a desired sloped profile may be formed in the plunger corresponding to the sloped profile 512. A portion of the dry film 508 may further be removed in the region proximate the tip recess 504 as shown in FIG. 5B.

In some embodiments, the sloped profile 512 can be made in other ways, such as by use of a two or three dimensional printer which deposits droplets of various conductive or non-conductive materials to build up the desired shape.

In some embodiments, at 626, a tip seed layer 514 may be deposited over the first dry film 508 and the substrate 502, including within the tip recess 504. The tip seed layer 514 typically comprises a material that facilitates subsequent deposition of the material to be utilized to form a tip in the tip recess 504. The tip seed layer 514 may be deposited, for example, by chemical or physical vapor deposition (CVD or PVD), atomic layer deposition (ALD), or like methods. Non-limiting examples of suitable materials for the tip seed layer 514 include any conductive material or materials conducive to the plating process (e.g., conductive materials that provide a suitable plating finish). In some embodiments where the tip and beam materials are the same, or where the different materials are otherwise compatible, deposition of a tip seed layer 514 may be omitted (i.e., 626 is not performed).

Figure 5C:
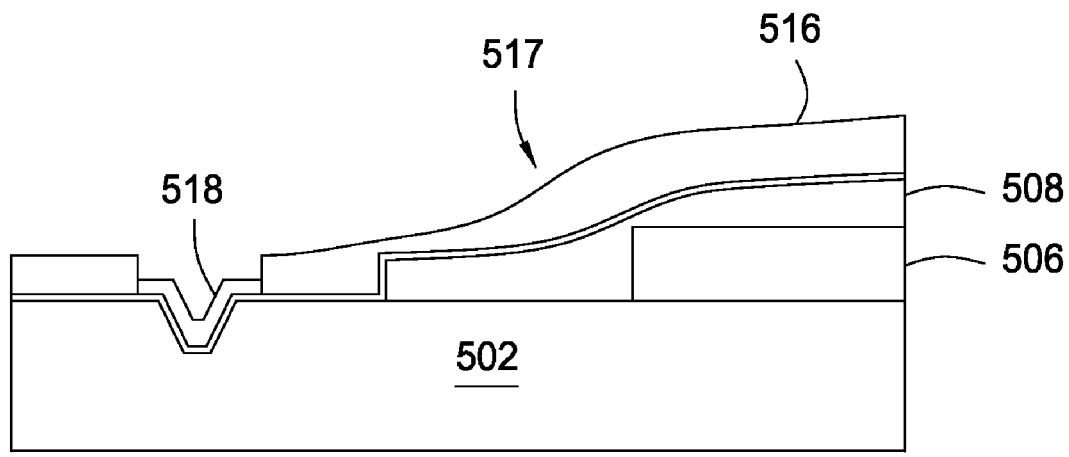

Next, at 628, a second dry film 516 may be deposited and patterned over the first dry film 508, as shown in FIG. 5C. The second dry film 516 is similar to the first dry film 508 and may be formed in the same manner and may comprise a similar or different material to the material of the first dry film 508. The second dry film 516 may form a sloped profile 517 in the same manner as discussed above with respect to 624. A portion of the second dry film 516 may be removed to form an opening proximate the tip recess 504 to facilitate forming a tip 518 therein. The second dry film 516 may form a mask having a desirably low height (for example, having an about 1:1 aspect ratio with respect to the opening corresponding to the tip recess 504), thereby facilitating increased plating rates and increased yield. In one embodiment, the second dry film 516 forms a mask about 55 μm in height.

Next, at 630, a beam 524 may be formed by depositing a material into the sloped element profile to form the resilient contact element 526. In embodiments where the tip seed layer 514 is deposited (as described above with respect to 626) a tip 518 may be formed over the tip seed layer 514 in a sub-step 632. The tip 518 may be formed in any suitable manner, such as by plating or the like. The tip 518 generally is formed to a thickness suitable to ensure uniform coverage and may range, in a non-limiting example, from between about 10 to 20 µm in thickness and provide sufficient thickness to withstand operational contact and cleaning wear. Suitable non-limiting examples of materials which could be used for the tip 518 include noble metals and semi-noble metals, such as palladium, gold, rhodium, and combinations or alloys thereof, and the like.

Figure 5D:
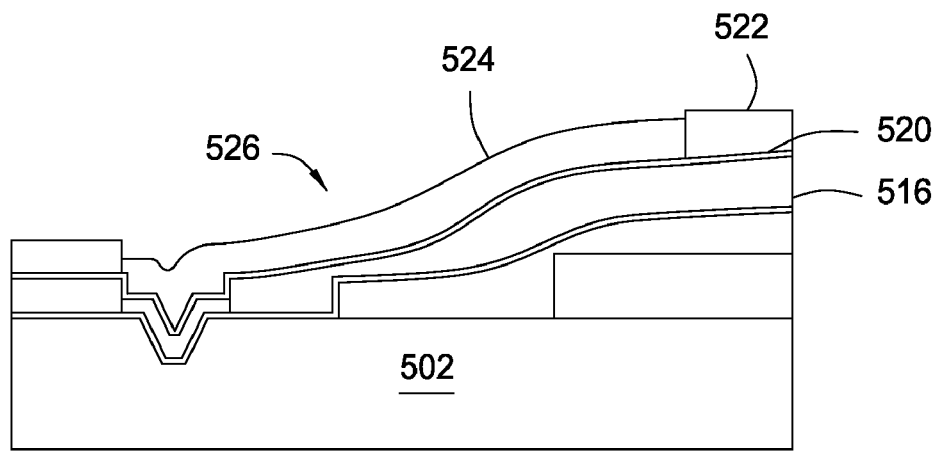

Next, at 634, a beam seed layer 520 may be deposited over the second dry film 516, as shown in FIG. 5D. In some embodiments where the tip seed layer 514 is not utilized, the process continues directly to 634 where the beam seed layer 520 may be deposited over the second dry film 516 and into the tip recess 504 of the substrate 502. In some embodiments where a tip seed layer 514 is utilized and a tip 518 is formed thereover in 632, the beam seed layer 520 may be deposited over the tip 518 in addition to over the second dry film 516. The beam seed layer 520 typically comprises a material that facilitates subsequent deposition of the material to be utilized to form the beam 524 and may be formed in a similar manner as discussed above with respect to forming the tip seed layer 514.

Next, at 636, the beam 524 may be formed over the beam seed layer 520 to form the resilient contact element 526. The beam 524 may be formed by depositing material atop the beam seed layer 520 within a patterned mask 522 to a desired thickness. The mask 522 may have a desirably low height, thereby facilitating increased plating rates for forming the beam 524, forming the beam 524 in a single step, and improved plating thickness control. In one embodiment, the second dry film 516 forms a mask about 110 µm in height. Although shown in cross-section, the mask 522 may also define the boundaries of the beam 524 along its length and may be configured to form a beam having a uniform or a tapered width, as discussed above. Suitable non-limiting examples of materials which could be used for the beam are discussed above with respect to the beam 204 shown in FIG. 2.

Figure 5E:
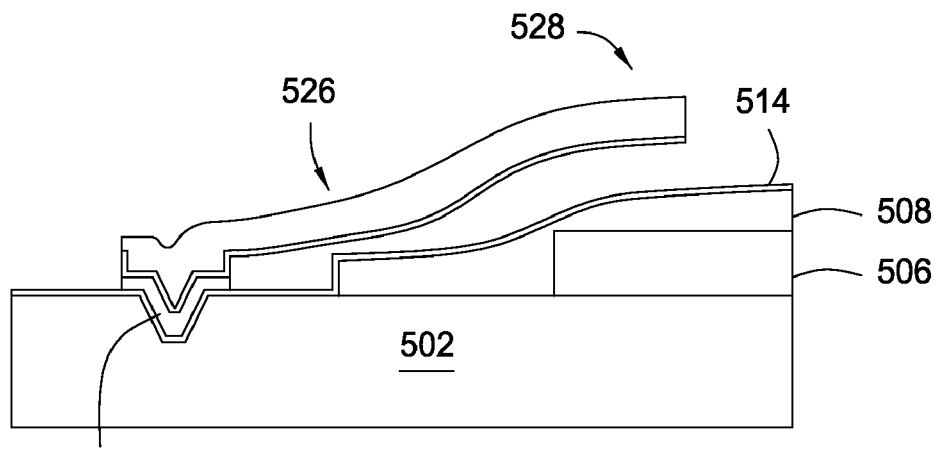

Next, at 640, the resilient contact element 526 may be removed from the substrate 502. The resilient contact element 526 may be removed from the substrate 502 by removing at least the second dry film 516 during a sub-step 642, as shown in FIG. 5E. The second dry film 516 may be removed by a dry plasma process, such as ashing.

Figure 5F:
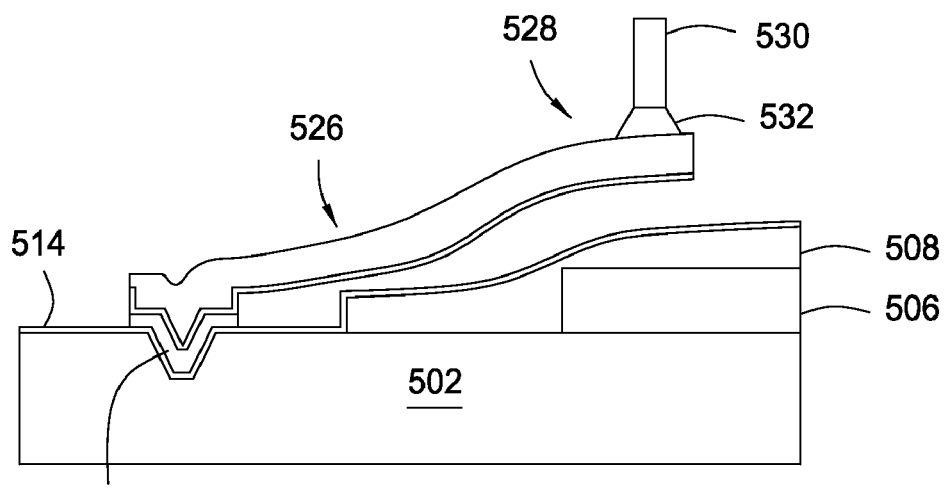

In some embodiments, at 644, a post 530 may be affixed to an end 528 of the resilient contact element 526, as shown in FIG. 5F. The post 530 may be affixed to the resilient contact element 526 in any suitable manner, such as by soldering, brazing, wire-bonding, molding, or the like. For example, in some embodiments, and as depicted in FIG. 5F, the post 530 may be affixed to the end 528 by solder 532. Alternatively, the post 530 may be wire bonded to the end 528 of the resilient contact element 526 and subsequently over-coated and planarized to form the post 530. Alternatively, the post 530 may be molded onto the end 528 of the resilient contact element 526 and subsequently electroplated to form the post 530. It is contemplated that the post 530 may alternatively be affixed to the end 528 of the resilient contact element 528 prior to the removal of the second dry film 516 (such as is shown in FIG. 5D) utilizing any of the methods described above. Optionally, the post 530 may be coupled to a support substrate either prior to or after affixing the post 530 to the resilient contact element 528. The support substrate may be a temporary support for the post 530 or may be a component of a probe card assembly (such as the probe substrate 424 depicted in FIG. 4).

Next, at 646, the resilient contact element 526 may be released from the substrate 518. In some embodiments the resilient contact element 526 may be removed from the substrate 502 by etching away, i.e., undercutting the beam seed layer 520 by undercutting the tip seed layer 514 (when present), or the beam seed layer 520, thus freeing the resilient contact element 526 from the substrate 502. The substrate 502 may then be reused to form additional resilient contact elements 526 by repeating one or more portions of the above process. In embodiments where only the second dry film 516 is removed, the substrate may be reused to form additional resilient contact elements 526 by repeating 630 through 640.

FIGS. 7A-G depict illustrative stages of fabrication of a resilient contact element in accordance with some embodiments of the present invention. FIG. 8 depicts a process 800 of fabricating the contact element as shown in FIGS. 7A-G according to some embodiments of the invention. The materials and processes in the method 800 may be similar to those in the method 600 and may be referenced above with respect to the description of FIGS. 5-6.

Figure 7A:
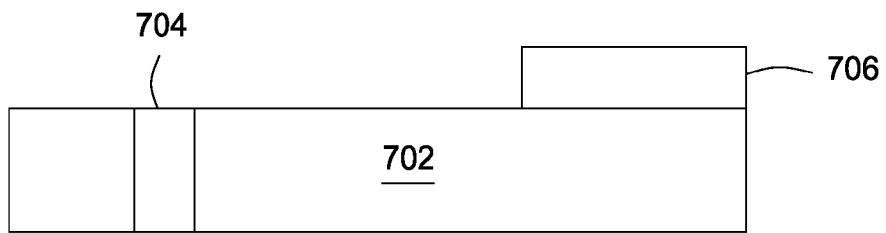
FIGS. 7A-G depict stages of fabrication of a resilient contact element in accordance with some embodiments of the present invention.
Figure 8:
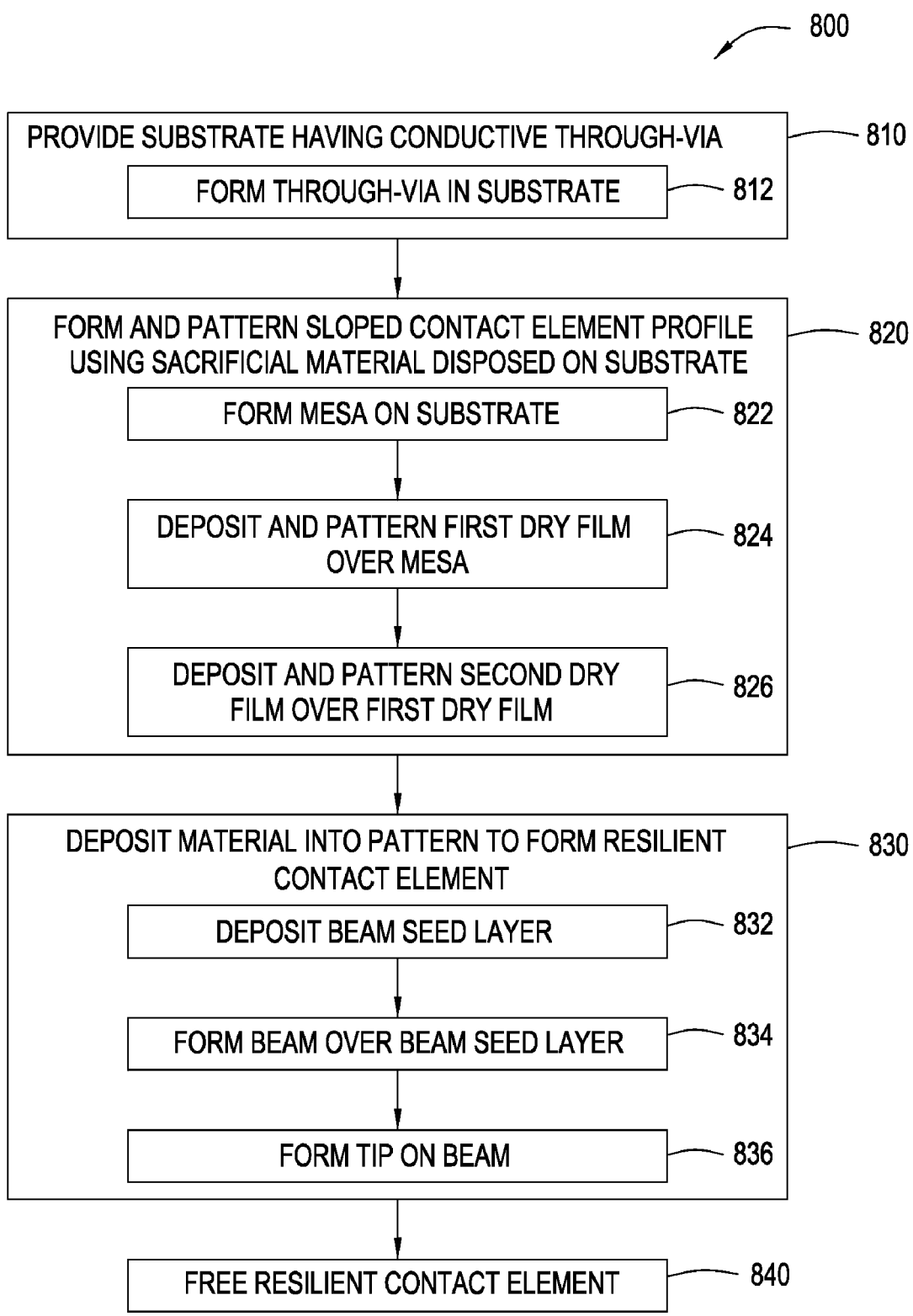
FIG. 8 depicts a flowchart for fabricating the resilient contact element depicted in FIG. 7A-G.

At 810 a substrate 702 can be provided having a conductive through via 704 disposed therein, as depicted in FIG. 7A. The through via 704 may be a conductive through via fabricated from a metal such as copper and its alloys, and the like. In some embodiments, at 812, the through via 704 may be formed in the substrate by conventional etching and deposition methods.

Figure 7B:
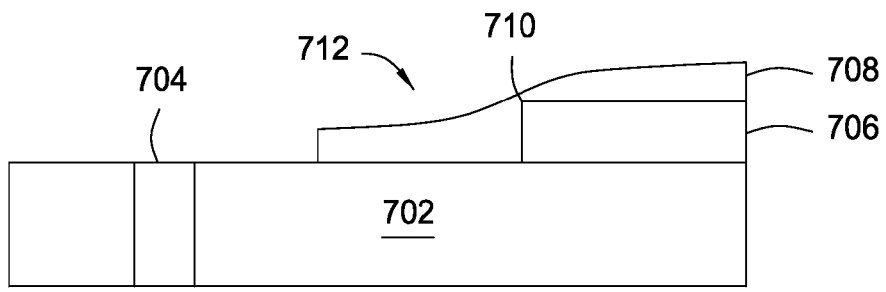
Figure 7C:
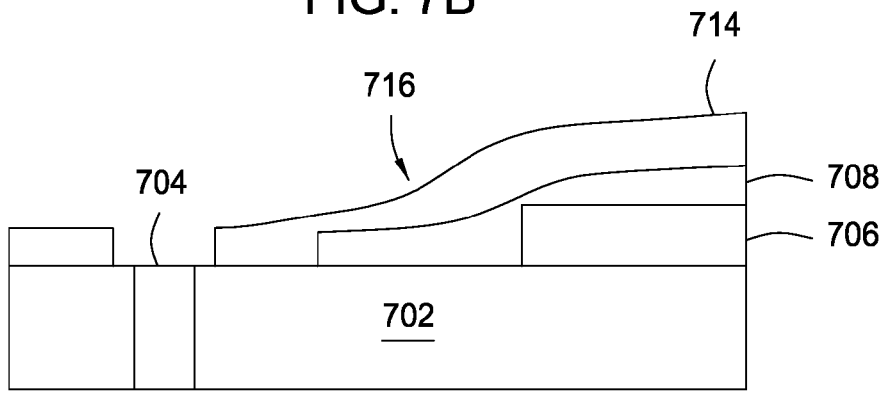

Next, at 820, a sloped element profile may be formed and patterned using a sacrificial material disposed on the substrate 702, as shown in FIGS. 7A-C. A mesa 706 may be formed on the substrate 702 (as shown in FIG. 7A) at 822 if desired. Next, at 824, a first dry film 708 may be deposited and patterned over the mesa 706 to form a sloped profile 712 in the first dry film 708 (as shown in FIG. 7B). Next, at 826, a second dry film 714 may be deposited and patterned over the first dry film 708 to form a sloped profile 716 corresponding to the desired sloped profile for the resilient contact element (as shown in FIG. 7C). Suitable materials for the first and second dry films can be as those described above.

Figure 7D:
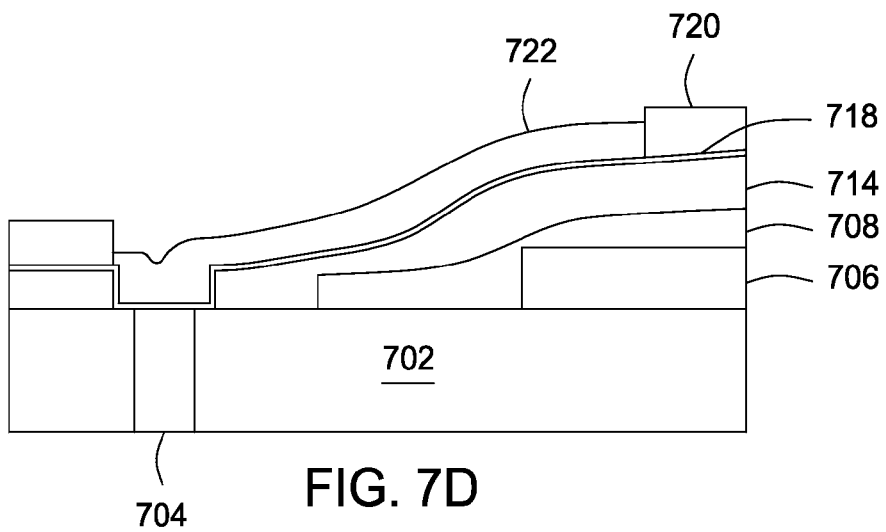
Figure 7E:
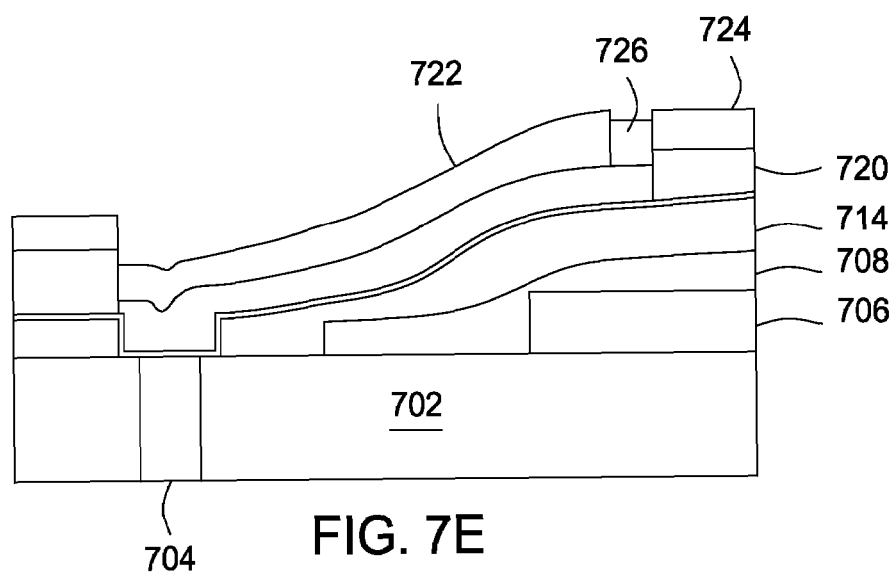

Next, at 830, a beam 722 may be formed by depositing a material over the second dry film 714 to form the resilient contact element. A beam seed layer 718 may be deposited over the second dry film 714 (as shown in FIG. 7D) at 832, if desired. Next, at 834, the beam 722 may be formed by depositing material atop the beam seed layer 718 within a patterned mask 720 to a desired thickness. Suitable materials for the first and second dry films can be as those described above. At 836, a tip 726 may be formed on the beam 722, for example, by depositing and patterning a mask 724 over the beam 722 corresponding to a location where the tip 726 is to be formed and subsequently depositing a material atop the beam 722 to form the tip 726 (as shown in FIG. 7E). Although FIG. 7 illustrates one type of tip 726, other tip geometries may similarly be used in various embodiments of the invention.

Figure 7F:
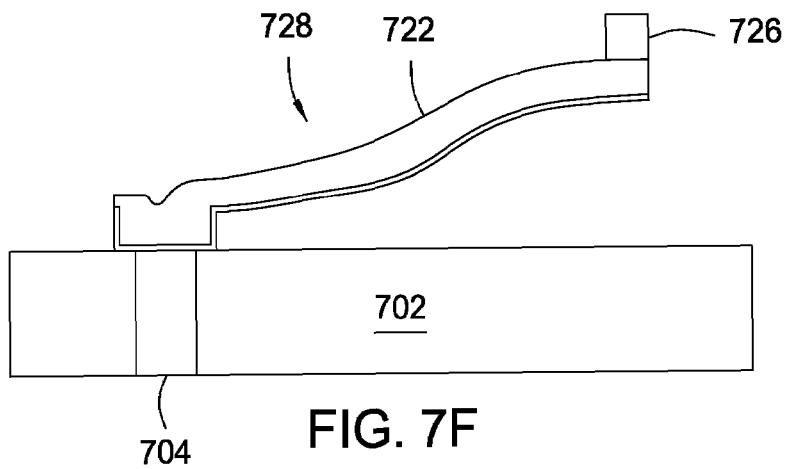
Figure 7G:
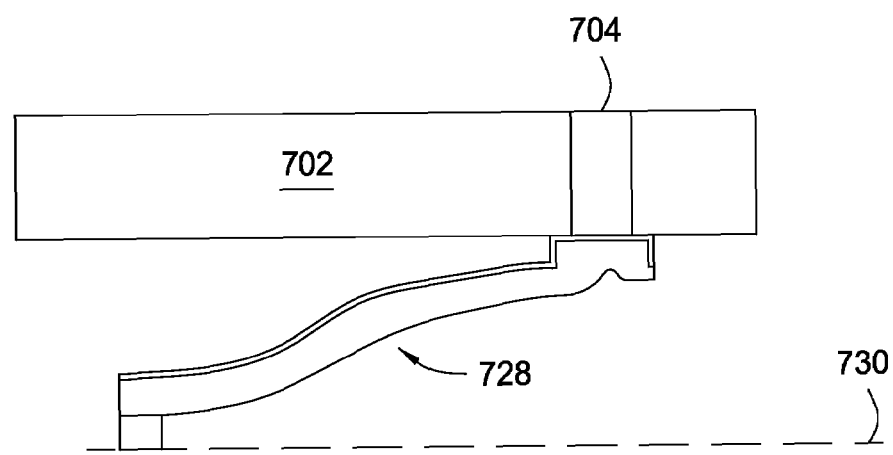

Next, at 840, the resilient contact element 728 may be released (as shown in FIG. 7F). The contact element 728 may be freed by removing the photo-resist masks 720, 724, the beam seed layer 718, the first and second dry film layers 708, 714, and the mesa 706, such that the resilient contact element 728 is free to move and is supported by the substrate 702 proximate the through via 704. The substrate 702 remains supporting the resilient contact element 728 (as shown in FIG. 7G) such that the substrate 702 may be incorporated into an apparatus for utilizing the resilient contact element 728 (such as the probe card assembly discussed above with respect to FIG. 4).

According to some embodiments, a resilient contact element may be formed by deforming a contact element having a first topography to create a resilient contact element having a desired second topography. In some embodiments, the first topography may be planar. As used herein, planar refers to substantially planar structures such as may be formed in a non-limiting example, via lithographic methods. The contact element may also be non-planar and may optionally have planar portions. The contact element may be part of a contact element assembly and, in some embodiments, the planar contact element may comprise a tip end, a beam end, and an attachment end. The tip end and attachment end may be moved apart relative to one another to deform the contact structure in a direction at least partially parallel to the deforming force. In some embodiments, the resilient contact structure may be subjected to a thermal process during and/or after the deformation of the resilient contact structure, such as, for example, heating of at least a portion of the contact structure while holding the tip end and attachment end in a desired spaced-apart relation. The thermal process may further comprise cooling the resilient contact structure while maintaining the spaced-apart relation between the tip end and attachment end.

Figure 9A:
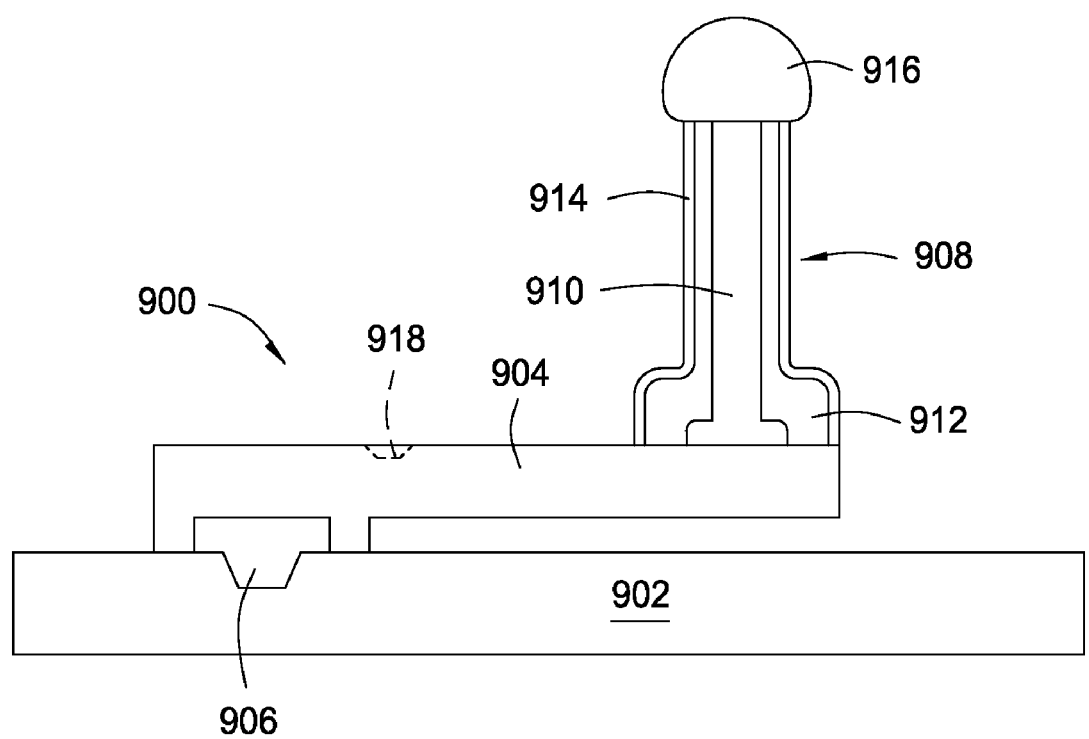
FIGS. 9A-C depict stages of fabrication of a resilient contact element in accordance with some embodiments of the present invention.
Figure 9B:
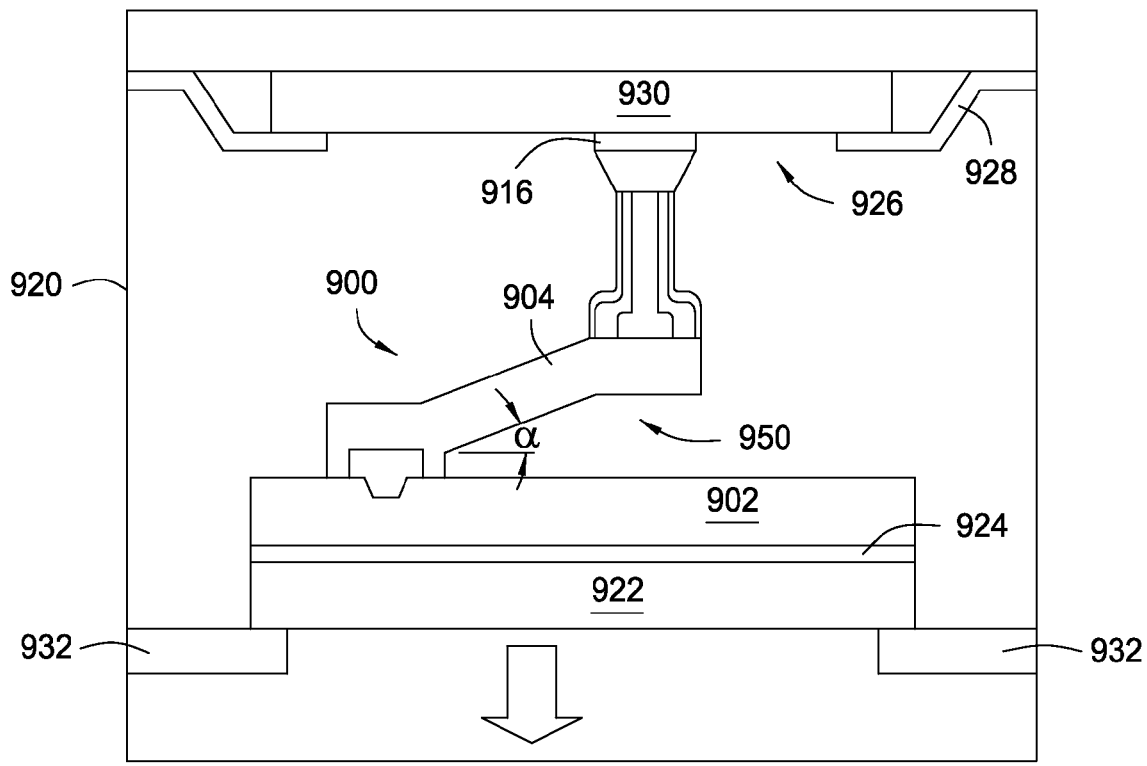
Figure 9C:
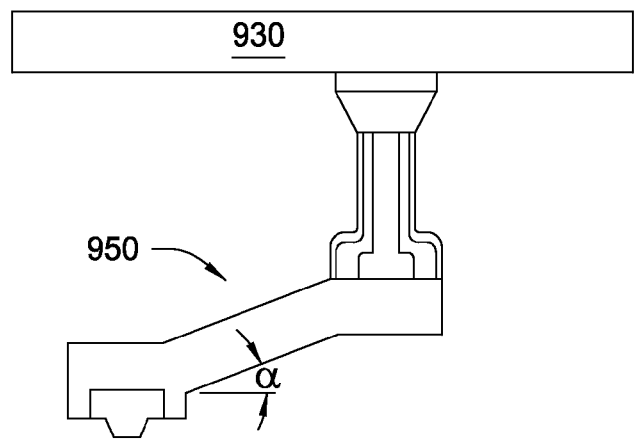
Figure 10:
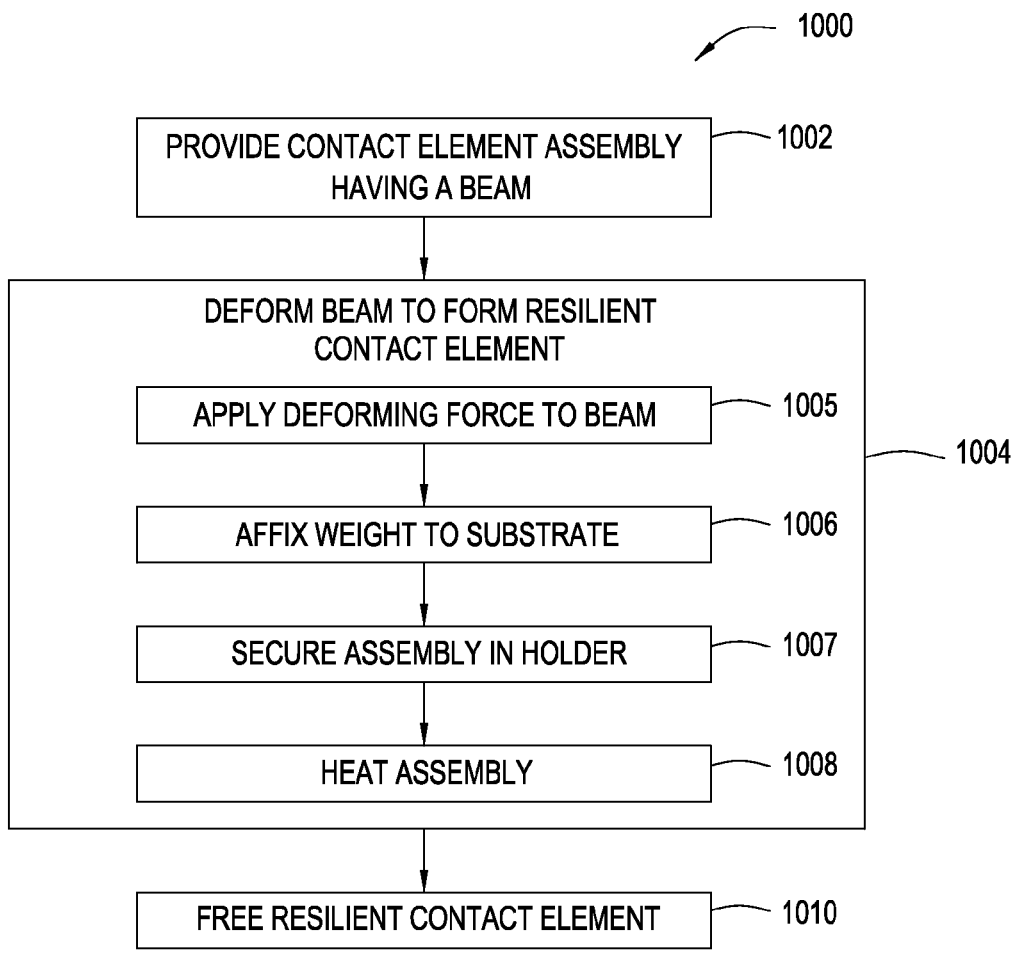
FIG. 10 depicts a flowchart for fabricating the resilient contact element depicted in FIGS. 9A-C.

For example, FIGS. 9A-C depict illustrative stages of fabrication of an illustrative resilient contact element in accordance with some embodiments of the present invention. It is contemplated that resilient contact elements having other configurations may be fabricated utilizing the inventive process disclosed herein. FIG. 10 depicts an exemplary process 1000 for fabricating a contact element in accordance FIGS. 9A-C. At 1002 a contact element assembly 900 may be provided (as shown in FIG. 9A). The contact element assembly 900 may generally include a beam 904 having a tip 906 disposed at a first end of the beam 904 and a post 908 disposed at an opposing second end of the beam 904. The tip 906 and, optionally, a portion of the beam 904 proximate the tip 906, may be coupled to a substrate 902. In some embodiments, the post 908 may comprise a wire 910 that is bonded to the second end of the beam 904 and having one or more overcoats 912, 914 formed upon the wire 910. A ball of solder 916 may be deposited at the top of the post 908.

Next at 1004, the beam 904 may be deformed to form a resilient contact element. The beam 904 may be deformed by moving either or both of the first end of the beam 904 and the second end of the beam 904 in an opposing direction relative to each other. In some embodiments, this may be accomplished by applying a deforming force to the beam at 1005, for example, by securing either or both of the first end and the second end of the beam 904 and providing a force sufficient to move the first and second ends of the beam 904 in opposing directions. In some embodiments, one of the first or the second end of the beam 904 may be secured and the force of gravity may be sufficient to move the ends in opposing directions.

Optionally, one or more portions of the beam 904 may be modified to control the deformation of the beam 904. Generally, the beam 904 may be weakened at selected locations where it is desired to obtain greater deformation of the beam 904. Examples of such locations include at least proximate the tip 906 and/or proximate the post 908. For example, as shown in phantom in FIG. 9A, one or more notches 918 may be provided in the beam 904 to reduce the cross-sectional area of the beam at that location, thereby increasing the force applied to that area and causing greater deformation of the beam 904 proximate that area. The controlled deformation of the beam 904 in this manner, allows for greater control over the angle of deformation of the beam (depicted as an angle, a in FIGS. 9B and 9C). Specifically, by controlling the regions of the beam 904 that deform first (and greatest), the angle α may be increased, thereby providing greater clearance for any particles that may be disposed beneath the beam 904 when the resilient contact element is in use.

Although one notch 918 is depicted on a top surface of the beam 904 in FIG. 9A, one or more notches may be provided on any surface of the beam 904 (e.g., the top, either side, or bottom of the beam 904), or on combinations of surfaces (e.g., top and bottom, both sides, all surfaces, or the like). In addition, the notches may be of any suitable size or combination of sizes suitable to facilitate increasing local deformation without impairing the structural integrity of the beam 904 during or upon completion of the fabrication process (e.g., without causing the beam to become damaged or to break). In addition to notches, other local beam-weakening mechanisms may be employed, such as indenting, crimping, or the like. Alternatively or in combination, local force-increasing mechanisms may be utilized as well. For example, portions of the beam may be supported, such as by clamps, splints, or the like, to prevent deformation in certain areas of the beam and allow deformation where desired.

In some embodiments a weight 922 may be affixed to the substrate 902 of the contact element assembly 900 at 1006 to increase the force applied to the contact element assembly 900. The weight 922 may be secured to the substrate 902 in any suitable manner, such as by bolting, clamping, bonding, or the like. In some embodiments, a layer of adhesive 924 may be utilized to affix the weight 922 to the substrate 902. Prior or subsequent to 1006, the contact element assembly 900 may be attached to a substrate 930, by any suitable manner, such as clamping, brazing, bonding, soldering, or the like. In some embodiments, for example, the ball of solder 116 may be heated sufficiently to liquefy the solder 916, then allowing the solder 916 to cool while holding the contact element assembly 900 and the substrate 930 in place. Alternatively, in some embodiments the post 908 and/or the second end of the beam 204 may be mechanically secured to the substrate 930 and held in a position to apply the deforming force to the contact element assembly 900.

In some embodiments, the post 208 and/or the second end of the beam 204 of the contact element assembly 900 may be secured in place by a holder at 1007, such as the holder disposed in an upper region of the oven 920 shown in FIG. 9B. The holder may comprise any suitable mechanism for securing the substrate 930, such as brackets 928. Alternatively, the post 208 and/or the second end of the beam 204 may be removably secured to the holder.

Optionally, at 1008, at least a portion of the contact element assembly 900 may be heated while applying a deforming force to the contact element assembly 900 (as shown in FIG. 9B). The heating of the contact element assembly 900 may be performed in any suitable manner, such as by exposure to a radiation source (e.g., infrared, x-ray, laser, or the like), passing an electrical current through the contact element assembly 900, placing the contact element assembly 900 in an oven (as shown), or the like.

Optionally, heating at least a portion of the contact element assembly 900 may further include exposing the contact element assembly 900 to a thermal cycle during and/or after application of the deforming force to the contact element assembly 900, such as, for example, a heating and cooling cycle. The thermal cycle can include raising the temperature of the oven to expose the contact element assembly 900 to a temperature that is greater than a restructuring, or recrystallization, temperature for the materials comprising the beam 904. The contact element assembly 900 can then be cooled to a temperature below the restructuring temperature for the materials comprising the beam 904 while maintaining the desired deformation of the beam 904 to facilitate maintaining the deformed shape of the beam 904 upon removal of the deforming force. The thermal cycle may comprise a temperature ramp-up time, a temperature hold time and a temperature ramp-down time. The thermal cycle generally comprises at least a temperature hold time sufficient to allow permanent deformation of the beam 904 when the force on the contact element assembly 900 is removed. It is contemplated that plastic deformation of the beam 904 may occur prior to heating the beam 904 and that a plastically deformed beam 904 may be heated to cause reflow of the materials comprising the beam 904 subsequent to any such plastic deformation.

The temperature of the remaining components of the contact element assembly 900 may generally be held low enough to prevent damaging the components, or their connections. For example, in the embodiment depicted in FIG. 9, the temperature can be held to a level less than a melting point of the solder 916 to prevent the contact element assembly 900 from becoming separated from the substrate 930. This may be accomplished via one or more of the material selection for any of the components of the contact element assembly 900, selectively heating the beam 904, utilization of heat sinks to draw excess heat away from desired components, combinations thereof, or the like. For example, the beam 904 may comprise a material having a recrystallization temperature that is below a critical temperature for any connection between components of the contact element assembly 900 or between the contact element assembly 900 and any supports (such as substrate 930). In some embodiments, the beam 904 may comprise a material having a recrystallization temperature between about 200-250 degrees Celsius (for example, nickel).

Optionally, one or more shims 932 may be disposed at a desired location to control the amount of deformation of the beam 904 by providing a stop against which the substrate 902 or weight 922 may rest during the process (as shown in FIG. 9B). Upon exposing the contact element assembly 900 to the thermal cycle, a resilient contact element assembly 950 having a sloped profile may thereby be formed. In embodiments where an oven 920 is used, after cooling the resilient contact element assembly 950, the resilient contact element assembly 950 may be removed from the oven 920. Next, at 1006, the substrate 902 may be removed from the resilient contact element assembly 950.

Figure 12C:
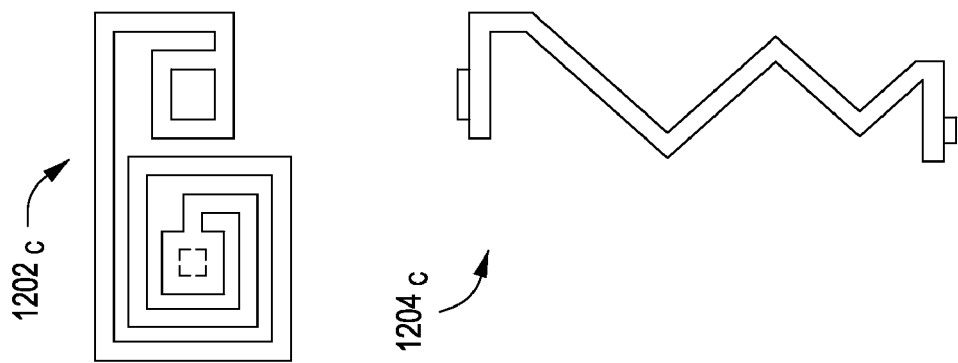
FIGS. 12A-C depict illustrative resilient contact elements according to some embodiments of the invention.
Figure 12B:
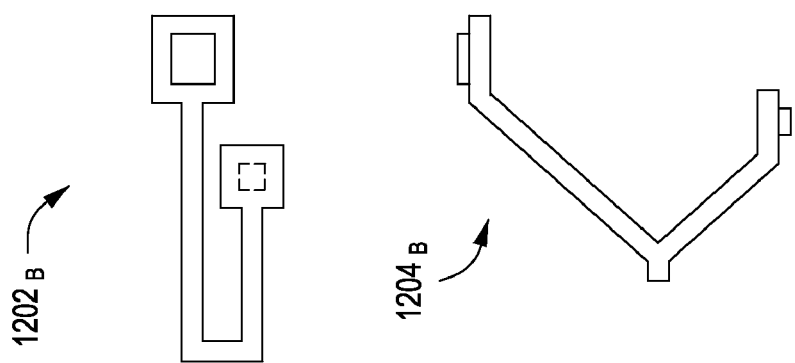
Figure 12A:
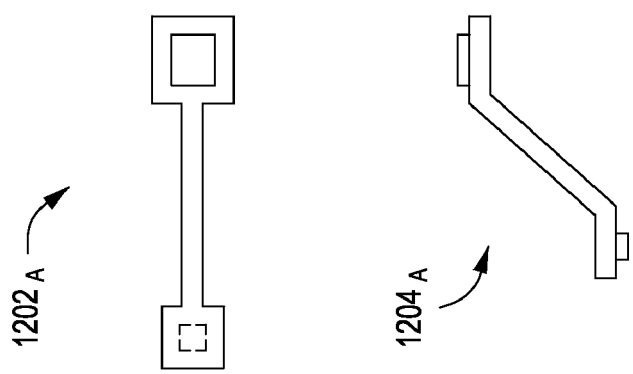

The foregoing method of fabricating resilient contact elements is illustrative only, and may further be utilized to form a myriad variety of resilient contact elements and other structures by providing a structure having a first topography that is deformed as described above to create a desired second topography. For example, FIGS. 12A-C depict illustrative resilient contact elements according to some embodiments of the invention. Each of FIGS. 12A-C depict a top view of a substantially planar structure 1202$_A$, 1202$_B$, 1202$_C$, that may be deformed using the teachings disclosed herein to create deformed structures 1204$_A$, 1204$_B$, 1204$_C$. These non-limiting examples are intended to show the flexibility of the inventive methods for fabricating desired structures.

Thus, embodiments of a resilient contact element, and probe card assemblies incorporating same, having improved capability to withstand particle strikes during testing of a device under test (DUT) have been provided herein. Methods for the fabrication and use of the resilient elements have been further provided. The resilient contact elements advantageously provides reduced probability of particle strikes and reduced probability of damage from any particle strikes that may occur. The resilient contact elements further advantageously provide a decreased scrub and scrub ratio as compared to conventional contact elements.

While the foregoing Figures and discussion depict certain embodiments of a resilient contact element, it is contemplated that resilient contact elements having alternate geometries and/or combining features of the various embodiments disclosed above may be devised without departing from the basic scope thereof, and the scope thereof is determined by the claims that follow.

The invention claimed is:

1. A resilient contact element for use in a probe card, comprising:
   a lithographically formed resilient beam having a first end and an opposing second end;
   a tip disposed proximate the first end of the beam and configured to break through an oxide layer of a surface of a device to be tested to establish reliable electrical connection therewith;
   a post disposed proximate the second end of the beam, the beam being coupled to the post; and
   wherein upper and lower surfaces of the beam, in at least a central portion between the first end and the second end of the beam, have a continuously curved sloped profile defining, in a relaxed state wherein the tip is in contact with the device to be tested, a particle clearance height measured between the beam and a plane representing an upper surface of a the device to be tested that is greater near the second end of the beam than near the first end of the beam and increases continuously from the first end of the beam to the second end of the beam.

2. The resilient contact element of claim 1, wherein the resilient contact element has a lower scrub ratio for a given particle clearance height of the resilient contact element when contacting a device under test as compared to a similarly sized contact element comprising a horizontal beam.

3. The resilient contact element of claim 1, wherein the particle clearance height increases non-linearly along a middle portion of the beam in a direction from the first end of the beam to the second end of the beam.

4. The resilient contact element of claim 1, wherein the particle clearance height proximate the second end of the beam is sufficient to avoid contacting an about 100 μm particle when engaged against a device under test.

5. The resilient contact element of claim 1, wherein the beam is configured to provide a contact pressure at the tip of less than about 20 grams force.

6. The resilient contact element of claim 1, wherein the beam has a spring constant of between about 0.5-5 grams force per mil of movement.

7. The resilient contact element of claim 1, wherein the tip comprises the same materials as the beam.

8. The resilient contact element of claim 1, wherein the beam has a width that tapers from the second end towards the first end.

9. The resilient contact element of claim 1, wherein the beam consists essentially of one or more plated layers.

10. A probe card assembly for testing a semiconductor, comprising:
    a probe substrate; and
    a resilient contact element coupled to the probe substrate, the resilient contact element comprising:
       a lithographically formed resilient beam having a first end and an opposing second end; and a tip disposed proximate the first end of the beam and configured to break through an oxide layer of a surface of a device to be tested to establish reliable electrical connection therewith;

a post disposed proximate the second end of the beam, the post coupling the beam to the probe substrate; and wherein upper and lower surfaces of the beam between the first end and the second end have a curved sloped profile defining, in a relaxed state wherein the tip is in contact with the device to be tested, a particle clearance height measured between the beam and a plane representing an upper surface of a device to be tested that is greater near the second end of the beam than near the first end of the beam and increases continuously from the first end of the beam to the second end of the beam.

11. The assembly of claim 10, wherein the resilient contact element has a lower scrub ratio for a given particle clearance height of the resilient contact element when contacting a device under test as compared to a similarly sized contact element comprising a horizontal beam.

12. The assembly of claim 10, wherein the particle clearance height increases non-linearly along a middle portion of the beam in a direction from the first end of the beam to the second end of the beam.

13. The assembly of claim 10, wherein the tip comprises the same material as the beam.

14. The assembly of claim 10, wherein the beam has a width that tapers from the second end towards the first end.

15. The assembly of claim 10, wherein the resilient contact element is disposed beneath the probe substrate.

16. The assembly of claim 10, wherein the beam consists essentially of one or more plated layers.

* * * * *